United States Patent
Asadi et al.

(10) Patent No.: US 11,467,938 B2
(45) Date of Patent: Oct. 11, 2022

(54) READ RETRY THRESHOLD OPTIMIZATION SYSTEMS AND METHODS CONDITIONED ON PREVIOUS READS

(71) Applicant: SK hynix Inc., Gyeonggi-do (KR)

(72) Inventors: Meysam Asadi, Fremont, CA (US); Aman Bhatia, Los Gatos, CA (US); Fan Zhang, Fremont, CA (US)

(73) Assignee: SK hynix Inc., Gyeonggi-do (KR)

( * ) Notice: Subject to any disclaimer, the term of this patent is extended or adjusted under 35 U.S.C. 154(b) by 102 days.

(21) Appl. No.: 17/026,544

(22) Filed: Sep. 21, 2020

(65) Prior Publication Data
US 2022/0091953 A1 Mar. 24, 2022

(51) Int. Cl.
| | |
|---|---|
| *G06F 11/30* | (2006.01) |
| *G06F 11/07* | (2006.01) |
| *G06K 9/62* | (2022.01) |
| *G11C 16/26* | (2006.01) |
| *G11C 16/34* | (2006.01) |
| *G11C 16/14* | (2006.01) |

(52) U.S. Cl.
CPC ........ *G06F 11/3037* (2013.01); *G06F 11/076* (2013.01); *G06K 9/6215* (2013.01); *G11C 16/14* (2013.01); *G11C 16/26* (2013.01); *G11C 16/3431* (2013.01)

(58) Field of Classification Search
CPC ...... G06K 9/6215; G11C 16/14; G11C 16/26; G11C 16/3431; G06F 11/3037; G06F 11/076
See application file for complete search history.

(56) References Cited

U.S. PATENT DOCUMENTS

| | | | | |
|---|---|---|---|---|
| 10,943,669 | B2 * | 3/2021 | Zhang | G11C 29/028 |
| 2015/0019922 | A1 * | 1/2015 | Leem | G11C 16/3418 714/706 |
| 2016/0357472 | A1 * | 12/2016 | Choi | G06F 11/0754 |
| 2017/0162270 | A1 * | 6/2017 | Park | G11C 16/26 |
| 2018/0113758 | A1 * | 4/2018 | Choo | G11C 29/021 |
| 2018/0158493 | A1 * | 6/2018 | Ryu | G06F 11/08 |
| 2018/0197619 | A1 * | 7/2018 | Chen | G11C 11/5628 |
| 2019/0243734 | A1 * | 8/2019 | Kim | G06F 12/0246 |
| 2020/0118620 | A1 | 4/2020 | Bazarsky et al. | |
| 2020/0159447 | A1 * | 5/2020 | Luo | G06F 3/0679 |
| 2020/0176066 | A1 * | 6/2020 | Her | G11C 16/26 |
| 2020/0202952 | A1 * | 6/2020 | Lee | G11C 16/3495 |
| 2020/0219571 | A1 | 7/2020 | Chen et al. | |
| 2020/0395090 | A1 * | 12/2020 | Kang | G11C 16/3481 |
| 2021/0027845 | A1 * | 1/2021 | Lu | G06F 3/0604 |

* cited by examiner

*Primary Examiner* — Guy J Lamarre
(74) *Attorney, Agent, or Firm* — IP & T Group LLP

(57) ABSTRACT

A controller optimizes read retry thresholds for a memory device using one or more previous reads and a condition. The controller determines a read level table based on a condition indicative of a state of the memory device and selects an entry among multiple entries in the selected read level table based on a historical read threshold. For the selected entry, the controller: determines fail bits for data associated with multiple read operations on the cells using multiple read retry thresholds; and determines an order of the multiple read retry thresholds based on the fail bits determination.

20 Claims, 11 Drawing Sheets

FIG. 8A

Read Level Table

| Entry | | |
|---|---|---|
| 0 | $RR_0$ | |
| 1 | $RR_1$ | |
| 2 | $RR_2$ | |
| ⋮ | ⋮ | |
| K | $RR_k$ | |

History Read — Read Retry Reads(HRRs)

FIG. 8B

HRR-LUT$_{(c)}$($t_c$) for condition (c)

| HR | $HRR_1$ | $HRR_2$ | $HRR_3$ | ⋯ | $HRR_{te}$ |
|---|---|---|---|---|---|
| $RR_0$ | $RR_{10}$ | $RR_{22}$ | $RR_{49}$ | ⋯ | $RR_{42}$ |
| $RR_1$ | $RR_{49}$ | $RR_{44}$ | $RR_{27}$ | ⋯ | $RR_{47}$ |
| $RR_2$ | $RR_{22}$ | $RR_{49}$ | $RR_{42}$ | ⋯ | $RR_{27}$ |
| ⋮ | ⋮ | ⋮ | ⋮ | ⋱ | ⋮ |
| $RR_{49}$ | $RR_5$ | $RR_{18}$ | $RR_{49}$ | ⋯ | $RR_{42}$ |

Input: (condition $c$, $S_{RR}$, $CC_{th}$)
- Collect sample set $S_c$
- Set $S_{RR}$ be all possible RRs.
- For each $RR_H \in S_{RR}$:
    - Step 1: $S_{RR} = S_{RR \setminus RR_H}$
    - Step 2: $S_c = S_c - \{s \in S_c | FBC_s^{RR_H} \leq CC_{th}\}$
    - Step 3: Set $HRR_c(RR_H) = RR_H$
    - Step 4: Find $RR^* = \arg\max_{RR \in S_{RR}} P(FBC \leq CC_{th} | S_c)$
        - Append $RR^*$ into $HRR_c(RR_H)$
        - $S_{RR} = S_{RR \setminus RR^*}$
        - $S_c = S_c - \{s \in S_c | FBC_s^{RR^*} \leq CC_{th}\}$
    - Step 5: If $|HRR_c(RR_H)| > t$ or $|S|$ is small, stop; Otherwise go to step 4.

Output: $HRR_c$

FIG. 12

Input: ($c' \notin C$, HR):
- Find closet condition $c_1, c_2 \in C$
- $HRR_{c'}(HR) = $ Interpolate ($HRR_{c_1}(HR)$, $HRR_{c_2}(HR)$)

Output: $HRR_{c'}(HR)$

FIG. 13

Input: ($HR \notin S_{RR}$, $lcm \in LCM$):
- Given $VT_{HR}(lcm)$
    - Compute the distance $d(VT_{HR}(lcm), VT_{RR}(lcm))$ for all $RR \in RR_{default}$.
    - $i = \arg\min_i \{d(VT_{HR}(lcm), VT_{RR_i}(lcm)), RR_i \in S_{RR}\}$

Output: $index\ i$

READ RETRY THRESHOLD OPTIMIZATION SYSTEMS AND METHODS CONDITIONED ON PREVIOUS READS

BACKGROUND

1. Field

Embodiments of the present disclosure relate to a scheme for optimizing read retry thresholds in a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary is memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs). Memory systems may use various read biases, levels or thresholds (e.g., read retry thresholds) to perform read operations.

SUMMARY

Aspects of the present invention include a memory system and a method for optimizing read retry thresholds based on one or more previous reads and a condition of the memory system.

In one aspect, a memory system includes a memory device including a plurality of cells and a controller. The controller: determines a read level table based on a condition indicative of a state of the memory device, the read level table including multiple entries, each entry including a set of read thresholds including a historical read threshold and multiple read retry thresholds; and selects an entry among the multiple entries in the select read level table based on a historical read threshold. For the selected entry, the controller: determines fail bits for data associated with multiple read operations on the plurality of cells using the multiple read retry thresholds; and determines an order of the multiple read retry thresholds based on the fail bits determination.

In another aspect, a method for operating a memory system, which includes a memory device including a plurality of cells and a controller, includes: determining a read level table based on a condition indicative of a state of the memory device, the read level table including multiple entries, each entry including a set of read thresholds including a historical read threshold and multiple read retry thresholds; and selecting an entry among the multiple entries in the selected read level table based on a historical read threshold. For the selected entry, the method includes: determining fail bits for data associated with multiple read operations on the plurality of cells using the multiple read retry thresholds; and determining an order of the multiple read retry thresholds based on the fail bits determination.

In still another aspect, a memory system includes a memory device including a plurality of cells and a controller. The controller determines a read level table based on a condition indicative of a state of the memory device, the read level table including multiple entries, each entry including a set of read thresholds including a historical read threshold and multiple read retry thresholds. The controller determines whether a historical read threshold is included in a set of default read thresholds, which correspond to multiple historical read thresholds in the multiple entries. The controller determines whether the condition corresponds to any of multiple defined. When it is determined that the historical read threshold is included in the set of the default read thresholds and the condition corresponds to any of the multiple defined conditions, the controller selects an entry among the multiple entries in the selected read level table based on the historical read threshold. For the selected entry, the controller determines fail bits for data associated with multiple read operations on the plurality of pages using the multiple read retry thresholds, and determines an order of the multiple read retry thresholds based on the fail bits determination.

Additional aspects of the present invention will become apparent from the following description.

BRIEF DESCRIPTION OF THE DRAWINGS

FIG. 8A is a diagram illustrating a read level table.

FIGS. 8B and 8C are diagrams illustrating read level tables in accordance with an embodiment of the present invention.

FIGS. 11 through 13 are diagrams illustrating schemes for determining a selection order of read retry thresholds in accordance with an embodiment of the present invention.

DETAILED DESCRIPTION

Figure 1:
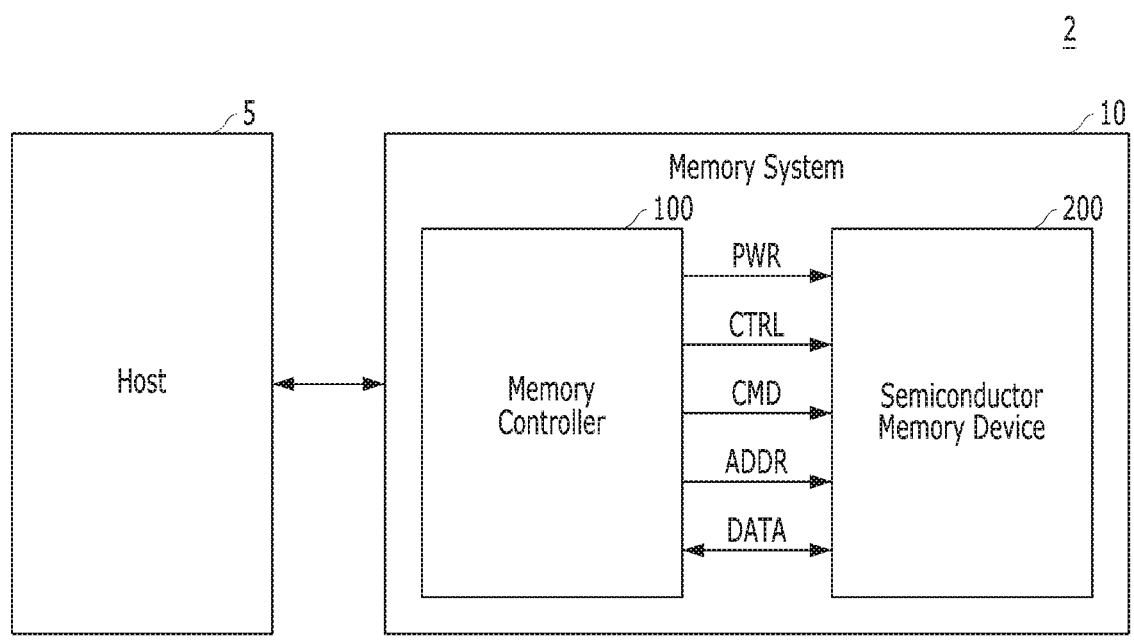
FIG. 1 is a block diagram illustrating a data processing system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any one of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any one of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operation of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
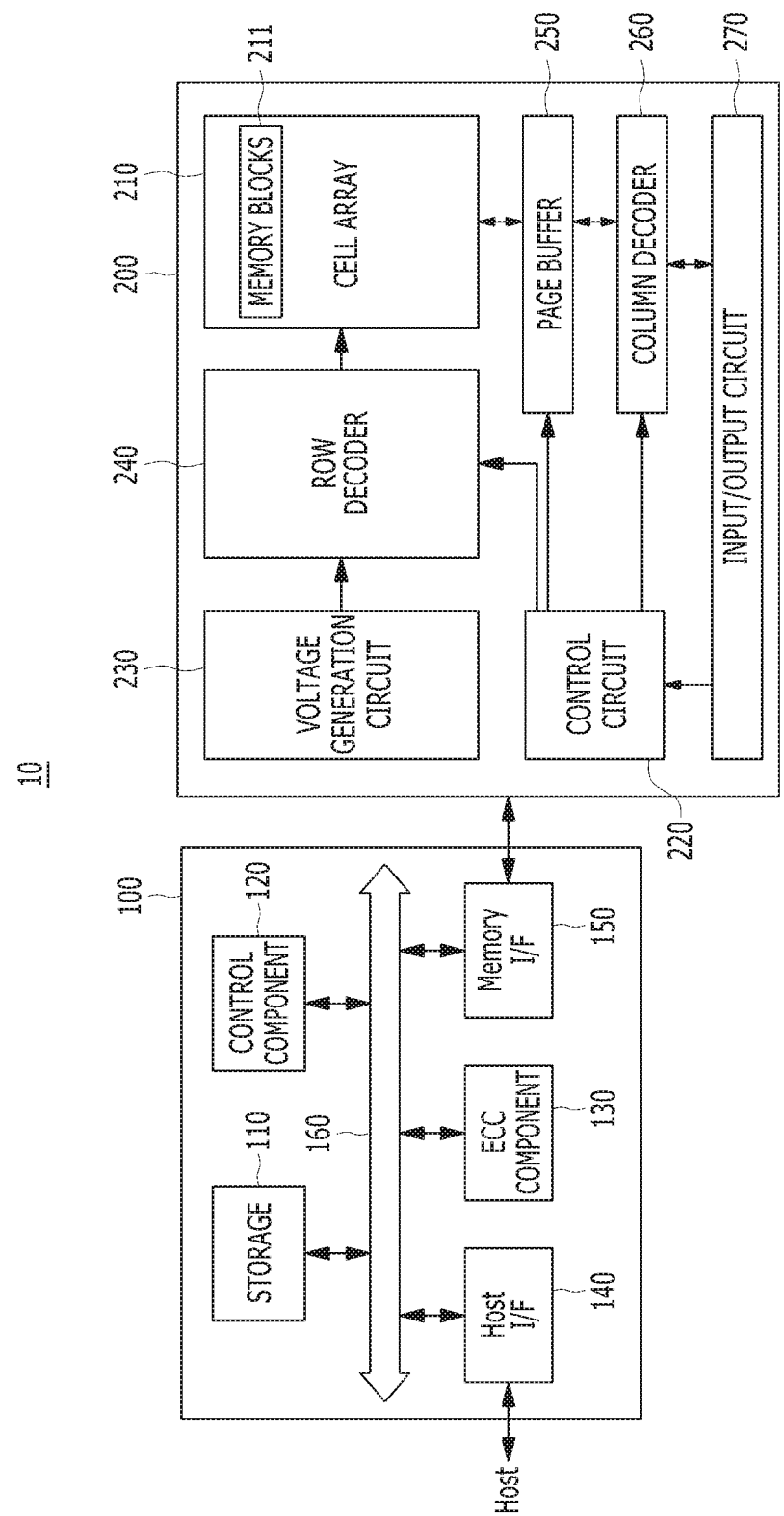
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operation of the memory system 10, and in particular a write operation and a read operation for the memory device 200, in response to a corresponding request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or ore of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (DATA), an enhanced small disk interface (ESDI), and/or an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation on the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
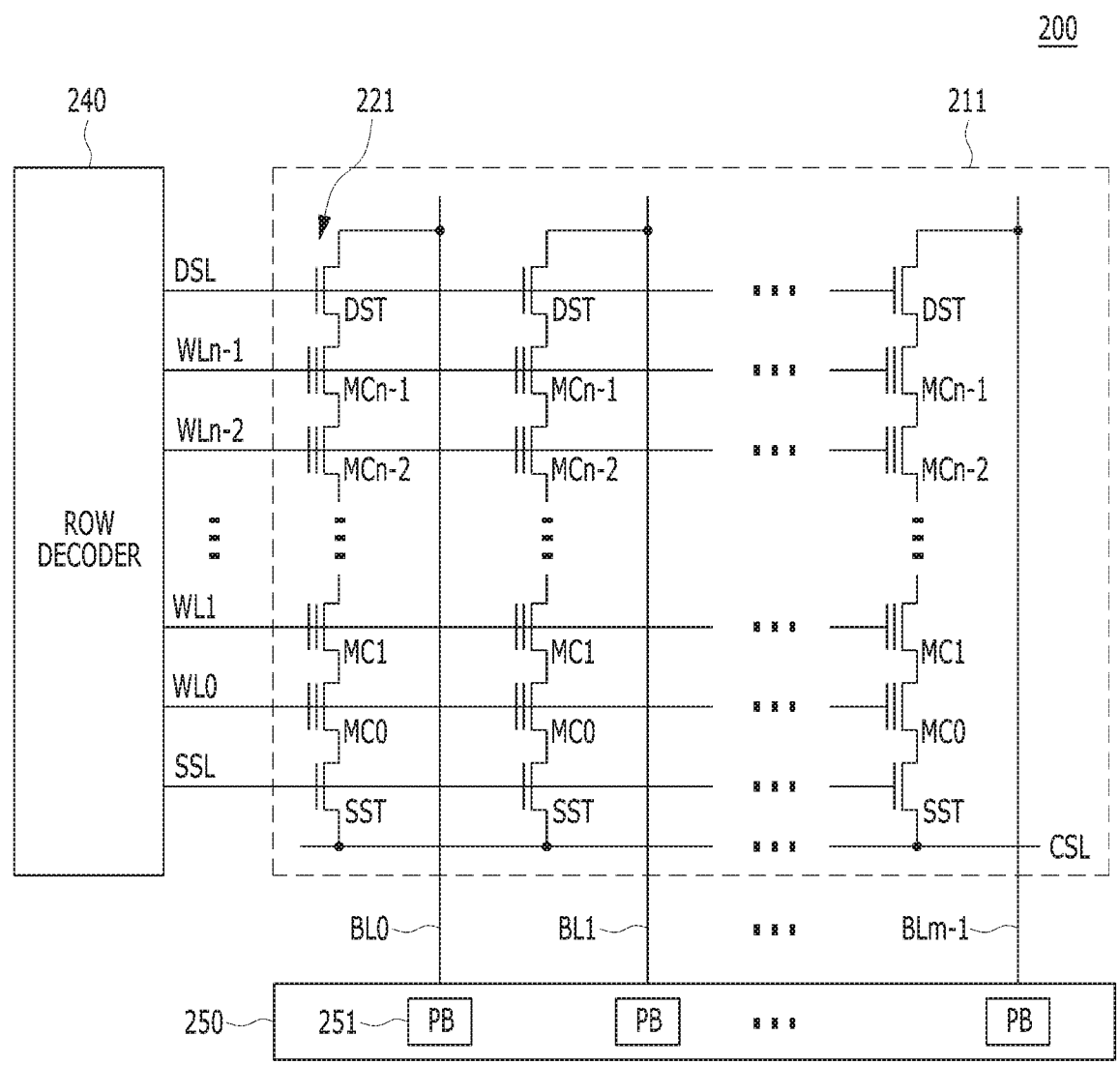
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a single level cell (SLC) storing 1 bit of data, a multi-level cell (MLC) storing 2 bits of data, a triple-level cell (TLC) storing 3 bits of data, or a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm-1. The page buffers 251 may operate in response to page buffer control signals. For example, the page buffers 251 my temporarily store data received through the bit lines BL0 to BLm-1 or sense voltages or currents of the bit lines during a read or verify operation.

In some embodiments, the memory blocks 211 may include NAND-type flash memory cells. However, the memory blocks 211 are not limited to such cell type, but may include NOR-type flash memory cells. Memory cell array 210 may be implemented as a hybrid flash memory in which two or more types of memory cells are combined, or one-NAND flash memory in which a controller is embedded inside a memory chip.

Figure 4:
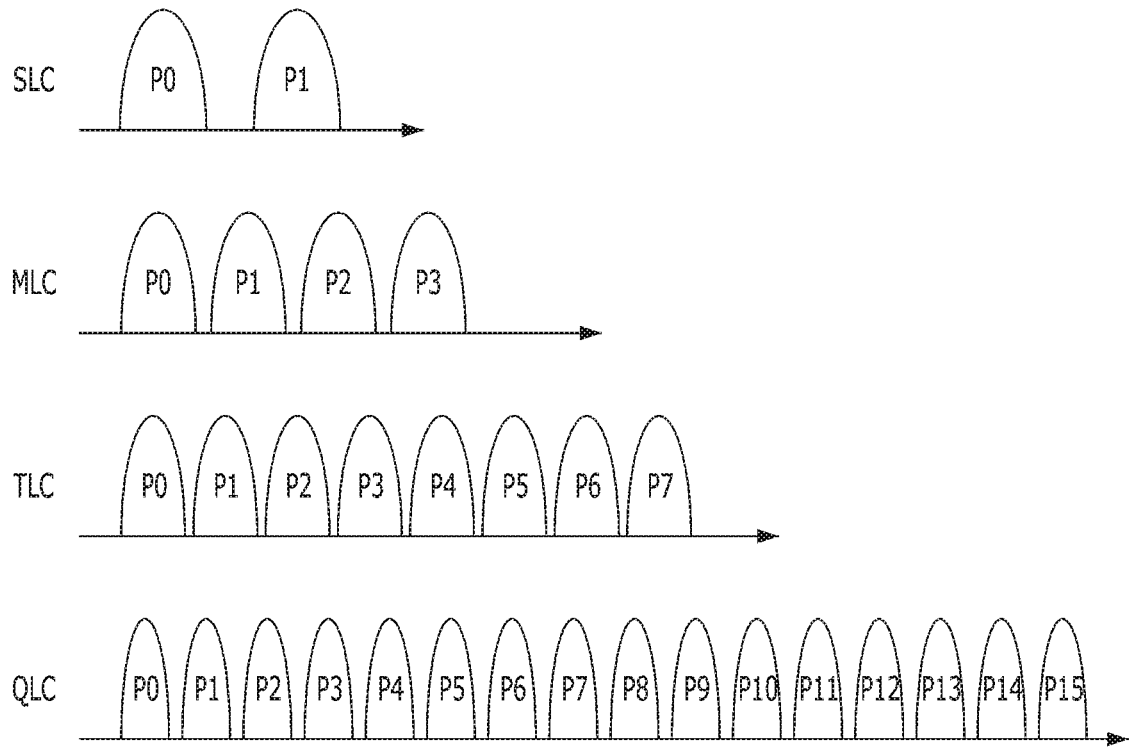
FIG. 4 is a diagram illustrating distributions of states for different types of cells of a memory device.

FIG. 4 is a diagram illustrating distributions of states or program voltage (PV) levels for different types of cells of a memory device.

As described above, each of memory cells may be implemented with a specific type of cell, for example, a single level cell (SLC) storing 1 bit of data, a multi-level cell (MLC) storing 2 bits of data, a triple-level cell (TLC) storing 3 bits of data, or a quadruple-level cell (QLC) storing 4 bits of data. Usually, all memory cells in a particular memory device are of the same type, but that is not a requirement. FIG. 4 shows the states for each of those types of cells.

An SLC may include two states P0 and P1. P0 may indicate an erase state, and P1 may indicate a program state. Since the SLC can be set in one of two different states, each SLC may program or store 1 bit according to a set coding method. An MLC may include four states P0, P1, P2 and P3. Among these states, P0 may indicate an erase state, and P1 to P3 may indicate program states. Since the MLC can be set in one of four different states, each MLC may program or store two bits according to a set coding method. A TLC may include eight states P0 to P7. Among these states, P0 may indicate an erase state, and P1 to P7 may indicate program states. Since the TLC can be set in one of eight different states, each TLC may program or store three bits according to a set coding method. A QLC may include 16 states P0 to P15. Among these states, P0 may indicate an erase state, and P1 to P15 may indicate program states. Since the QLC can be set in one of sixteen different states, each QLC may program or store four bits according to a set coding method.

Figure 5:
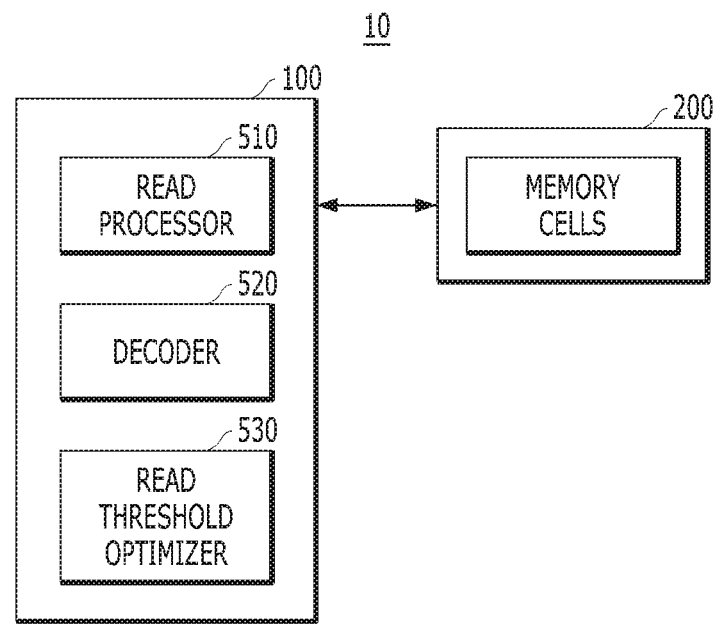
FIG. 5 is a diagram illustrating a memory system in accordance with an embodiment of the present invention.

FIG. 5 is a diagram illustrating a memory system 10 in accordance with an embodiment of the present invention.

Referring to FIG. 5, the memory system 10 may include a controller 100 and a memory device 200. The memory device 200 may include a plurality of memory cells (e.g., NAND flash memory cells). The memory cells are arranged in an array of rows and columns as shown in FIG. 3. The cells in each row are connected to a word line (e.g., WL0), while the cells in each column are coupled to a bit line (e.g., BL0). These word and bit lines are used for read and write operations. During a write operation, the data to be written ('1' or '0') is provided at the bit line while the word line is asserted. During a read operation, the word line is again asserted, and the threshold voltage of each cell can then be acquired from the bit line. Multiple pages may share the memory cells that are coupled to the same word line. When the memory cells are implemented with MLCs, the multiple pages include a most significant bit (MSB) page and a least significant bit (LSB) page. When the memory cells are implemented with TLCs, the multiple pages include an MSB page, a center significant bit (CSB) page and an LSB page. When the memory cells are implemented with QLCs, the multiple pages include an MSB page, a center most significant bit (CMSB) page, a center least significant bit (CLSB) page and an LSB page. The memory cells may be programmed using a coding scheme (e.g., Gray coding) in order to increase the capacity of the memory system 10 such as an SSD.

Figure 6:
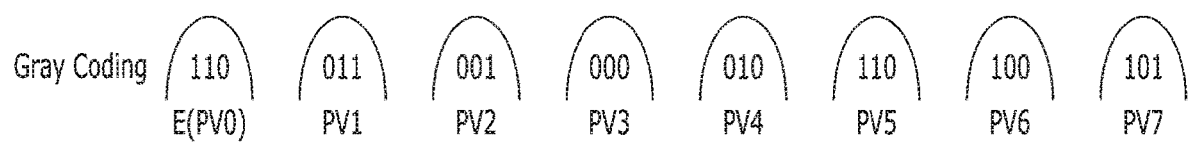
FIG. 6 is a diagram illustrating an example of Gray coding for a triple level cell (TLC).

FIG. 6 is a diagram illustrating an example of Gray coding for a triple level cell (TLC).

Referring to FIG. 6, a TLC may be programmed using Gray coding. As described above, a TLC may have 8 program states, which include an erased state E (or PV0) and first to seventh program states PV1 to PV7. The erased state E (or PV0) may correspond to "110." The first program state PV1 may correspond to "011." The second program state PV2 may correspond to "001." The third program state PV3 may correspond to "000." The fourth program state PV4 may correspond to "010." The fifth program state PV5 may correspond to "110." The sixth program state PV6 may correspond to "100." The seventh program state PV7 may correspond to "101."

Figure 7:
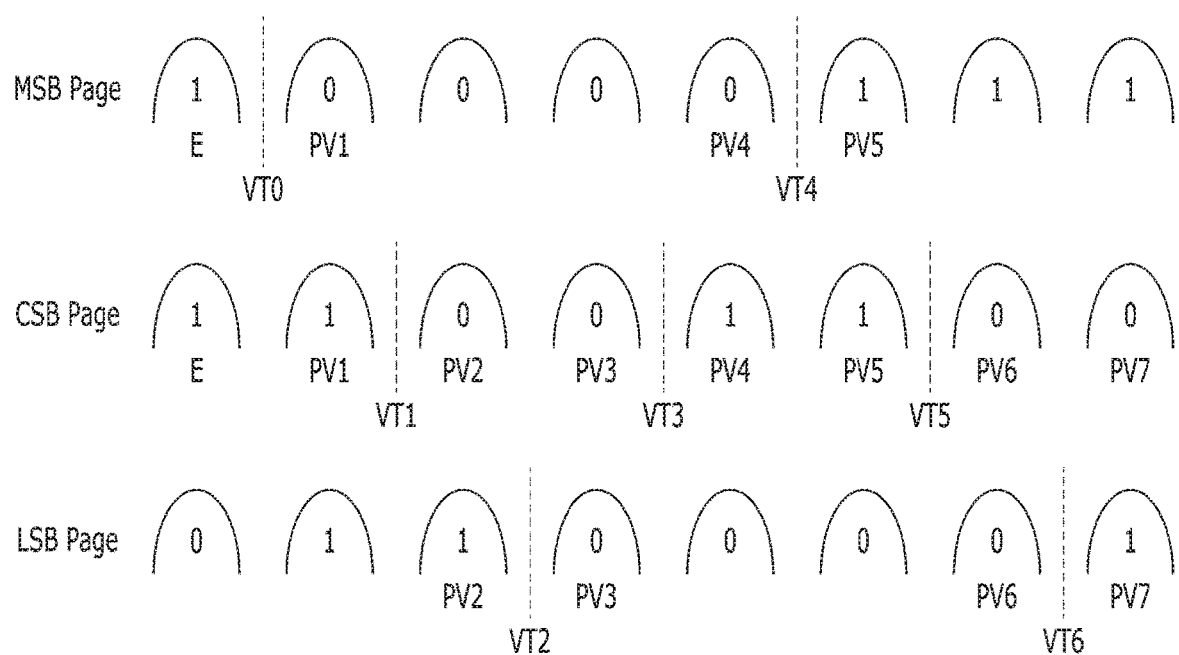
FIG. 7 is a diagram illustrating state distributions for pages of a triple level cell (TLC).

In a TLC, as shown in FIG. 7, there are 3 types of pages including LSB, CSB and MSB pages. 2 or 3 thresholds may be applied in order to retrieve data from the TLC. For an MSB page, 2 thresholds include a first threshold value VT0 and a second threshold value VT4. The first threshold value VT0 distinguishes between an erase state E and a first program state PV1. The second threshold value VT4 distinguishes between a fourth program state PV4 and a fifth program state PV5. For a CSB page, 3 thresholds include a first threshold value VT1, a second threshold value VT3 and a third threshold value VT5. The first threshold value VT1 distinguishes between a first program state PV1 and a second program state PV2. The second threshold value VT3 distinguishes between a third program state PV3 and the fourth program state PV4. The third threshold value VT5 distinguishes between the fifth program state PV5 and the sixth program state PV6. For an LSB page, 2 thresholds include a first threshold value VT2 and a second threshold value VT6. The first threshold value VT2 distinguishes between the second program state PV2 and the third program state PV3. The second threshold value VT6 distinguishes between the sixth program state PV6 and a seventh program state PV7.

Referring back to FIG. 5, the controller 100 may include a read processor 510, a decoder 520 and a read threshold optimizer 530. These components may be implemented by the control component 120 or internal components thereof, i.e., firmware (FW) in FIG. 2. Although not shown in FIG. 5, the controller 100 and the memory device 200 may include various other components as shown in FIG. 2.

The read processor 510 may control read operations for the memory device 200 in response to a read request from a host (e.g., the host 5 of FIG. 1). The read processor 510 may control the read operations based on various read thresholds. The decoder 520 may decode data associated with the read operations.

In some embodiments, the read processor 510 may control a read operation for the memory cells using a select read threshold from a set read level table. In some embodiments, the read level table may include multiple read thresholds and the select read threshold may include a default read threshold. When the read operation is performed for the MSB page of TLC, the select read threshold may include a pair of first and second read thresholds [VT0, VT4] as shown in FIG. 7. The first read threshold value VT0 is used to distinguish between an erase state (i.e., E) and a first program state (i.e., PV1), and the second read threshold value VT4 is used to distinguish between a fourth program state (i.e., PV4) and a fifth program state (i.e., PV5). When the read operation is performed for the LSB page of TLC, the select read threshold may include a pair of first and second read thresholds [VT2, VT6] as shown in FIG. 7. The first read threshold value VT2 is used to distinguish between a second program state (i.e., PV2) and a third program state (i.e., PV3), and the second read threshold value VT6 is used to distinguish between a sixth program state (i.e, PV6) and a seventh program state (i.e., PV7).

It may be determined whether the read operation using a read threshold selected from a read threshold set succeeded or failed, depending on the decoding result of the decoder 520. When the read operation using the selected read threshold failed, the read processor 510 may control one or more read retry operations for the memory cells using a read retry threshold. In some embodiments, the read retry involves performing 5 different read attempts with different but static read threshold settings.

Typically, memory cells of the memory device 200 gradually wear out due to program-erase (P/E) cycles, and default read thresholds are not optimal at all retention and read disturb conditions. When the number of bit errors in a page to be read exceeds the correction capability of an error correction scheme (i.e., error correction code (ECC) correction capability) in a decoder, additional read attempts for data recovery are required to decode the page successfully with different read threshold biases. The first two steps in the data recovery involve performing a history (or historical) read and high priority reads (i.e., read retry reads). Successful read thresholds associated with the last successful decoding are tracked and maintained in a set of historical read thresholds and a historical read threshold is used in the first step in the additional read attempt. In case of decoding failure after using a historical read threshold, several other read attempts (i.e., high priority reads or HRRs) are made. High priority read thresholds are static; that is, the order in which the high priority read thresholds are used for read retry is predetermined and does not change during the lifetime of the memory system (e.g., SSD).

Accordingly, rather than using a fixed HRR ordering, various embodiments provide a read retry threshold optimization scheme capable of obtaining optimal HRRs for each of all possible historical reads given a condition of a memory system (i.e., NAND condition). The read retry threshold optimization scheme may improve read quality of service (QoS) of a memory system without any change to hardware of the memory system.

Figure 8C:
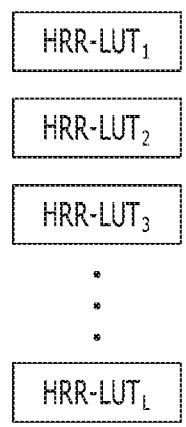

Referring back to FIG. 5, the controller 100 may include a read level table. For example, the read level table may be implemented within the storage 110 of FIG. 2. The read level table may store a plurality of read thresholds (e.g., K read thresholds $RR_0$ to $RR_K$) and may include multiple entries (e.g, K entries as shown in FIG. 8A). Each entry may correspond to each of the plurality of read thresholds and include a set of read thresholds among the plurality of read thresholds. Each entry may include a historical read threshold and multiple read retry thresholds. It is noted that multiple read retry thresholds herein and below indicate HRRs unless specifically defined. For example, as shown in FIG. 8B, each entry may include 5 different read thresholds, which includes one read threshold as a historical read threshold and 4 read thresholds as HRRs.

As described above, a static HRR ordering scheme may be typically used in read retry operations. In accordance with the static HRR ordering scheme, the order of the multiple read retry thresholds in each entry of a read level table is fixed. Examples of the static HRR ordering scheme for two different conditions of a memory system (e.g., TLC NAND SSD) are shown in FIG. 9.

Figure 9:
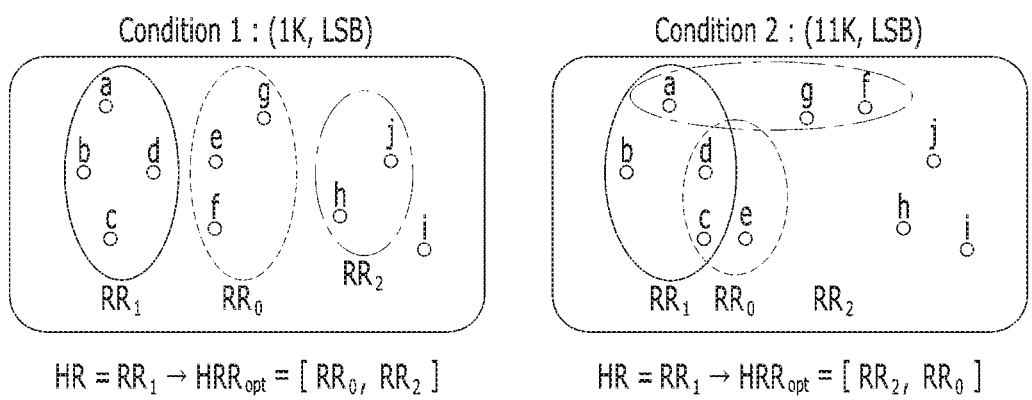
FIG. 9 is a diagram illustrating an operation of selecting read retry thresholds in accordance with an embodiment of the present invention.

In the illustrated examples of FIG. 9, it is assumed that there are two conditions: condition 1 (1K, LSB) and condition 2 (11K, LSB). 1K and 11K represent the number of erase/write (EW) cycles that have occurred at the time at which the HRR ordering scheme is applied, and LSB, i.e., least significant bit, represents the type of page of TLC to be read. In the two conditions, it is assumed that there are 10 pages, denoted by letters a to j and that only 3 different read biases $\{RR_0, RR_1, RR_2\}$ are available. Circles around pages indicate pages that are successfully decodable by ECC using the $RR_i$ for the corresponding circled group of pages. In both conditions, pages $\{a, b, c, d\}$ read by a read threshold $RR_1$ are successfully decodable. In condition 1, pages $\{e, f, g\}$ read by a read threshold $RR_0$ are successfully decodable, and pages $\{h, j\}$ read by a read threshold $RR_2$ are successfully decodable. In condition 2, pages $\{c, d, e\}$ read by a read threshold $RR_0$ are successfully decodable, and pages $\{a, g, f\}$ read by a read threshold $RR_2$ are successfully decodable. Given a historical read threshold $HR=RR_1$, the optimal read retry thresholds HRRs that follows HR are different for the different conditions. In condition 1, the optimal set of HRRs has the order of $[RR_0, RR_2]$. In condition 2, the optimal set of HRRs has the order of $[RR_2, RR_0]$. The main reason for this difference is that the dependencies between number of pages that RRs can correct are different in these conditions. Thus, any static HRR ordering would be suboptimal for at least one of these conditions.

The read threshold optimizer 530 may perform an optimal, non-static HRR ordering scheme. Results of the optimal HRR ordering scheme are illustrated in FIG. 8B.

In the illustrated example of FIG. 8B, there is a read level table HRR-LUT$_{(c)}$ for a condition (c) and the read level table includes 50 entries. Each entry may correspond to each of the plurality of read thresholds and include a set of read thresholds. An entry in the first row includes a historical read threshold $RR_0$ and multiple read retry thresholds (i.e., HRRs) in an order of $RR_{10}$, $RR_{22}$, $RR_{49}$ and $RR_{42}$. An entry in the second row includes a historical read threshold $RR_1$ and multiple read retry thresholds in an order of $RR_{49}$, $RR_{44}$, $RR_{27}$ and $RR_{47}$. An entry in the third row includes a historical read threshold $RR_2$ and multiple read retry thresholds in an order of $RR_{22}$, $RR_{49}$, $RR_{42}$ and $RR_{27}$. An entry in the 50th row includes a historical read threshold $RR_{49}$ and multiple read retry thresholds in an order of $RR_5$, $RR_{18}$, $RR_{49}$ and $RR_{42}$. As such, the read threshold optimizer 530 may determine different orders of read retry thresholds for different entries of the read level table.

In some embodiments, the controller 100 may include a plurality of read level tables corresponding to a plurality of conditions, respectively. In the illustrated example of FIG. 8C, the controller 100 may include L read level tables HRR-LUT$_1$ to HRR-LUT$_L$, where L is an integer of 2 or greater. Each read level table may correspond to a particular condition. By way of example and without any limitation, various conditions may be configured using values of the following elements: cumulative erase/write (EW) cycles, single page read (SPRD) cycles and type of page associated with the plurality of cells. That is, each condition may be a specific value from one or more of these condition elements. For example, the EW cycle values may be denoted as EW=$\{1, 1k, 5k, 9k, \ldots, ew_{max}\}$. Similarly, the SPRD cycle values may be SPRD=$\{0, 500k, \ldots, sprd_{max}\}$. For TLC NAND cells, page types include a most significant bit (MSB) page, a center significant bit (CSB) page and a least significant bit (LSB) page. For QLC NAND cells, page types include an MSB page, a center most significant bit (CMSB) page, a center least significant bit (CLSB) page and an LSB page. Thus, many different conditions may be configured by selecting a specific value from one or more the condition elements to cover a range of changes that may occur during the life of the memory device, e.g., NAND.

The read threshold optimizer 530 may select a read level table among a plurality of read level tables based on a condition, which is indicative of the state of the memory device. Further, the read threshold optimizer 530 may select an entry among the multiple entries in the selected read level table based on a previous history (historical) read threshold. In other words, the selected entry corresponds to the previous historical read threshold. Then, for multiple read thresholds (i.e., HRRs) of the select entry, the read threshold optimizer 530 may count fail bits for data associated with multiple read operations on the plurality of cells using the multiple read retry thresholds.

Further, the read threshold optimizer 530 may determine the order of the multiple read retry thresholds based on their fail bit counts In some embodiments, the read threshold optimizer 530 may determine the order of the multiple read retry thresholds by arranging the multiple read retry thresholds in ascending order of fail bit counts. This determination operation is described in detail with reference to FIG. 11.

It may be that the state of the memory device cannot be precisely defined by any combination of values of the condition elements defined above. In this case, an extrapolation is performed. That is, the read threshold optimizer 530 may determine two conditions among the possible conditions that best approximate the state of the memory device, select the two read level tables corresponding to the two conditions and interpolate between the two read level tables to generate an interpolated read level table. This interpolation operation is described in detail with reference to FIG. 12. Further, the read threshold optimizer 530 may use the interpolated read level table to perform the operations of selecting an entry, counting fail bits and determining the order of the multiple read thresholds described above.

In connection with generating the interpolated read level table, the previous historical read threshold has to be extrapolated. In this case, the read threshold optimizer 530 may determine a set distance (e.g., Euclidean distance) between the previous historical read threshold and each of the set of multiple read thresholds and select a read threshold with the lowest distance, among the set of multiple read thresholds. This determination operation is described in detail with reference to FIG. 13. Further, the read threshold optimizer 530 may determine an entry with the select read threshold as a historical read threshold and perform the operations of selecting an entry, counting fail bits and determining orders of the multiple read thresholds described above.

Figure 10:
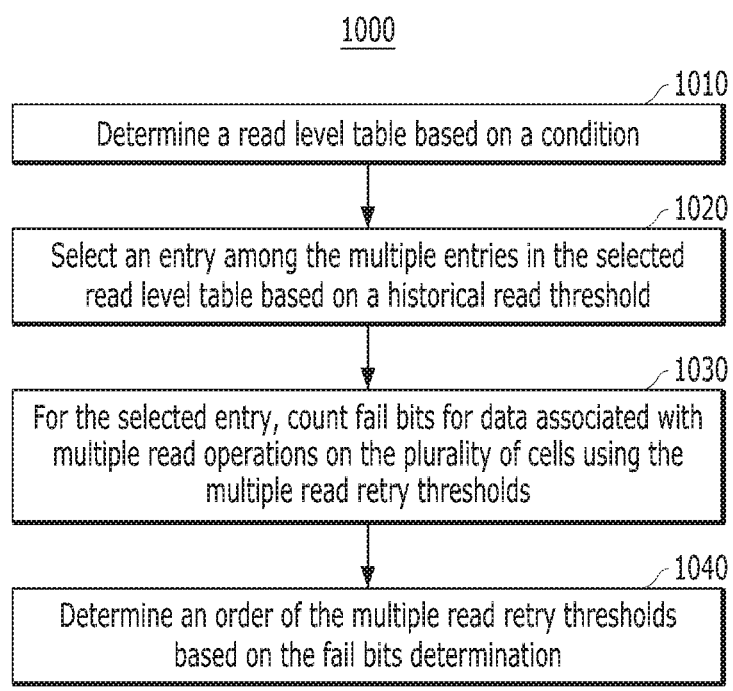
FIG. 10 is a flowchart illustrating a read retry threshold operation of a memory device.

FIG. 10 is a flowchart illustrating a read retry threshold optimization operation 1000 in accordance with an embodiment of the present invention. The read retry threshold optimization operation 1000 may be performed by firmware (e.g., the read threshold optimizer 530 of the controller 100 in FIG. 5).

Referring to FIG. 10, at operation 1010, the read threshold optimizer 530 may select a read level table among a plurality of read level tables based on a condition indicative of the state of the memory device. At operation 1020, the read threshold optimizer 530 may select an entry among the multiple entries in the select read level table based on a previous historical read threshold.

For the selected entry, operations 1030 and 1040 may be performed. At operation 1030, the read threshold optimizer 530 may count fail bits for data associated with multiple read operations on the plurality of cells using the multiple read retry thresholds. At operation 1040, the read threshold optimizer 530 may determine the order of the multiple read retry thresholds based on counting results of fail bits. In some embodiments, the read threshold optimizer 530 may determine the order of the multiple read retry thresholds by arranging the multiple read retry thresholds in ascending order of fail bit counts.

As described above, the read threshold optimizer 530 may determine the order of each of the read retry thresholds (i.e., HRRs) depending on one or more previous read attempts, the current NAND condition and the ECC correction capability. When a read operation is performed using the first read retry threshold (i.e., one HRR), a previous read attempt includes the read operation using the historical read threshold. When a read operation is performed using each of the remaining read retry thresholds, previous read attempts include the read operations using the historical read threshold and one or more previous read retry thresholds. Specifically, embodiments provide a Bayesian optimization algorithm to find optimal HRRs by taking into account i) all previous read attempts including historical read, ii) ECC correction capability iii) the NAND condition. This algorithm is described with reference to FIG. 11. Further, embodiments provide an algorithm to reduce the storage requirements of the HRRs determined by the Bayesian optimization algorithm. This algorithm is described with reference to FIG. 12. Furthermore, embodiments provide an algorithm to allow arbitrary historical read values to be used as input to the Bayesian optimization algorithm. This algorithm is described with reference to FIG. 13. Algorithms above may be combined and used as a read strategy, which is called a smart RRs read scheme. This read scheme improves the read latency enormously by finding effective read thresholds at a minor cost of additional storage required to store the optimal HRRs derived from the Bayesian optimization algorithm.

FIGS. 11 and 13 are diagrams illustrating schemes for determining an order in which read retry thresholds are selected (i.e., optimal HRR ordering scheme) in accordance with an embodiment of the present invention. The schemes may be performed by the read threshold optimizer 530 of the controller 100 in FIG. 5, which is implemented with firmware. In the description below, RR means a historical threshold, HRR means read retry thresholds, and read threshold(s) are sometimes referred to as read bias(es) or level(s) or voltage(s).

Referring to FIG. 11, the read threshold optimizer 530 may input information (condition c, $S_{RR}$, $CC_{th}$), perform operations of step 1 to step 5 and output $HRR_c$. In FIG. 11, various information including the input information are illustrated, which are defined in the following List 1:

---
List 1:

c: all the decoder observables of current NAND, i.e., memory device, condition.
$S_{RR}$: the set of all possible RRs.
$CC_{th}$: a correction capability threshold of the ECC (e.g., BCH).
$t_c$: the number of HRRs obtained from Bayesian optimization algorithm.
$S_c$: the set of all pages, (which contains the fail-bit counts of each page with all RRs $\in S_{RR}$) with condition c.
$RR_H$: the historical read threshold.
$HRR_c(RR_H)$: the optimal HRR order for condition c given the historical read $RR_H$.
$HRR_c$:
the set of optimal HRRs for condition c for all possible historical reads belonging to $S_{RR}$.

---

The read threshold optimizer 530 may collect the set of all pages $S_c$ and perform steps 1 to 5 for the historical read threshold $RR_H$ which belongs to the set of all possible RRs $S_{RR}$.

At step 1, the read threshold optimizer 530 may obtain $S_{RR}$ by excluding a historical read bias $RR_H$ from the set of default read biases $S_{RR}$ (i.e., $S_{RR} \backslash RR_H$ In the illustrated example of FIG. 8, when the set of default read biases includes $\{RR_0, RR_1, RR_2, \ldots RR_{49}\}$ and the historical read bias is $RR_0$, the set $S_{RR}$ may be determined to include $\{RR_1, RR_2, RR_3, \ldots RR_{49}\}$. When the set of default read biases includes $\{RR_0, RR_1, RR_2, \ldots RR_{49}\}$ and the historical read bias is $RR_1$, the set $S_{RR}$ may be determined to include $\{RR_0, RR_2, RR_3, \ldots RR_{49}\}$.

At step 2, the read threshold optimizer 530 may determine the set of available pages from the set of all pages at condition c through the equation $S_c = S_c - \{s \in S_c | FBC_s^{RR_H} \leq CC_{th}\}$. In this equation, $S_c$ is the set of available pages at condition c and $S_{success} = \{s \in S_c | FBC_s^{RR_H} \leq CC_{th}\}$ $S_{success}$ means those pages, which belong to the set $S_c$ such that their corresponding fail bit count (FBC) when they are read by the historical read bias $RR_H$ is less than or equal to the correction capability of the ECC ($CC_{th}$). In other words, $S_{success}$ represents those pages that can be successfully decoded by the decoder if they are read by the historical read bias $RR_H$.

At step 3, the read threshold optimizer 530 may set the optimal HRR order for condition c given the historical read $RR_H$ through the equation Set $HRR_c(RR_H) = RR_H$.

At step 4, the read threshold optimizer 530 may find RR* through the equation $$RR^* = \arg\max_{RR \in S_{RR}} P(FBC \leq CC_{th} | S_c).$$

In this equation, $P(FBC \leq CC_{th}|S_c)$ means a probability of fail bit count (FBC) of the pages in the set of available pages $S_c$ when they are read by a read bias RR are less than the ECC correction capability. In other words, $P(FBC \leq CC_{th}|S_c)$ means the decoder can correct these pages if they are read by the read bias RR. As such, the read threshold optimizer 530 may find the read bias RR (i.e., RR*) with the highest chance of decoding success (i.e., $P(FBC \leq CC_{th}|S_c)$ among all the RRs belonging to the set of default read biases.

Further, the read threshold optimizer 530 may append (or add) the read bias with highest chance of decoding success among the set of default read biases into the set of optimal HRRs. Thereafter, the read threshold optimizer 530 may perform an operation of finding the read bias with highest chance of decoding success among the remaining read biases in the set of default read biases. The finding operation for the remaining read biases may be iteratively performed when it is determined that a condition in step 5 is satisfied.

At step 5, the read threshold optimizer 530 may determine whether at least one of the following two conditions is satisfied: (1) $|HRR_c(RR_H)| > t$ or (2) $|S|$ is small. $|HRR_c(RR_H)|$ means the number of HRRs obtained from the Baysian optimization algorithm at condition c when the historical read is $RR_H$. t is $t_c$, which denotes the number of HRRs obtained from Bayesian optimization algorithm. |S| means the size of $S_c$, which denotes the set of remaining pages which hasn't decoded yet by the decoder at condition c. When one of the two conditions above is satisfied, that is, all HRRs have been found or the number of remaining pages (e.g., 100) is small, the iterative operation at step 4 is stopped.

Through the algorithm of FIG. 11, the read level table as shown in FIG. 8B is configured. In FIG. 8B, when the historical read threshold $RR_0$ in the first row is selected, multiple read operations may be performed using multiple read retry thresholds. Fail bits may be obtained through decoding data associated with the multiple read operations. An order of the multiple read retry thresholds may be determined based on fail bit counts. In some embodiments, the multiple read retry thresholds may be arranged in ascending order of fail bit counts. For example, the multiple read retry thresholds may be arranged in the order of $RR_{10} \rightarrow RR_{22} \rightarrow RR_{49} \ldots \rightarrow RR_{42}$. This ordering indicates that $RR_{10}$ has the highest chance of decoding success among the multiple read retry thresholds. Likewise, when the historical read threshold $RR_1$ in the second row is selected, multiple read retry thresholds may be arranged in the order of $RR_{49} \rightarrow RR_{44} \rightarrow RR_{27} \ldots \rightarrow RR_{47}$. When the historical read threshold $RR_2$ in the third row is selected, multiple read retry thresholds may be arranged in the order of $RR_{22} \rightarrow RR_{49} \rightarrow RR_{42} \ldots \rightarrow RR_{27}$. When the historical read threshold $RR_{49}$ in the fifth row is selected, multiple read retry thresholds may be arranged in the order of $RR_5 \rightarrow RR_{18} \rightarrow RR_{49} \ldots \rightarrow RR_{42}$.

As described above, the Bayesian optimization algorithm generates $HRR_c$ for condition c. In practice, it is infeasible to store $HRR_c$ for all possible NAND, i.e., memory device, conditions. This issue may be resolved by storing $HRR_c$ for a selected set of conditions. As noted above, the set of conditions needs to cover most changes that may occur in various dimensions of NAND evolution. Each NAND condition is (or can be approximated by) a combination of an erase/write (EW) cycle number, a single page read (SPRD) cycle number and a page type (LCM). Thus, each of the conditions may include an array of values as shown in List 2:

List 2:

EW = $\{1, 1k, 5k, 9k, \ldots, ew_{max}\}$
SPRD = $\{0.500k, \ldots, sprd_{max}\}$
LCM = $\{LSB, CSB, MSB\}$ With reference to List 2, the selected set of conditions C may be defined as shown in List 3:

List 3:

C = $\{c = (ew, sprd, lcm) \ \forall ew \in EW, \forall sprd \in SPRD, lcm \in LCM\}$ Given the $HRR_c$ for all the conditions $c \in C$, the read threshold optimizer 530 may use the interpolation scheme as shown in FIG. 12 to obtain the optimal HRRs for missing condition $c' \notin C$. In other words, when the condition c' does not correspond to any of the defined condition combinations, the read threshold optimizer 530 may determine two conditions $c_1, c_2$ which are closest to the condition c' among the defined conditions.

Further, the read threshold optimizer 530 may select two read level tables corresponding to the two conditions. Furthermore, the read threshold optimizer 530 may interpolate the two read level tables $HRR_{c_1}(HR)$, $HRR_{c_2}(HR)$ to generate an interpolated read level table and use the interpolated read level table to perform the Bayesian optimization algorithm in FIG. 11. In some embodiments, the interpolation may be done with a linear or nonlinear function; it depends on the missing dimension of condition c' and the neighboring conditions $c_1, c_2 \in C$.

As described above, the Bayesian optimization algorithm in FIG. 11 generates optimal HRRs when the historical read belongs to a default set of read biases ($S_{RR}$). Although the historical read bias starts by one of the default read biases, as NAND evolves, the historical read bias might take any voltage value which might not necessarily belong to the default read biases $S_{RR}$. As such, if $HR \notin S_{RR}$, $HRR_c(HR)$ does not exist in the table $HRR_c$. In this case, the read threshold optimizer 530 may use the algorithm as shown in FIG. 13 to find the closest default RR index to the current HR.

Referring to FIG. 13, $VT_{HR}(lcm)$ represents the historical read voltage for the type of page (lcm). For TLC cells, the page type could be {LSB page, CSB page, MSB page} and the historical read voltage has 7 floating values. Among 7 read voltages, 2 read voltages are for LSB page, 2 read voltages are for MSB page and 3 read voltages are for CSB page.

Given $VT_{HR}(lcm)$, the read threshold optimizer 530 may compute the distance $d(VT_{HR}(lcm), VT_{RR}(lcm))$ for all $RR \in RR_{default}$. The voltage of historical read (HR) might not belong to $S_{RR}$. For each $RR_i$ in the set of default read voltages (e.g., 50 default read voltages are available in $S_{RR}$), the read threshold optimizer 530 may compute a set distance (d) between a voltage of historical read for the page type lcm (i.e., $VT_{HR}(lcm)$) and a voltage of $RR_i$ for the page type lcm (i.e., $VT_{RR_i}(lcm)$). Among all the distances computed, the read threshold optimizer 530 may find the index of the smallest distance (i). Euclidean distance or any other suitable type of distance that can provide good estimation may be used.

As described above, when the historical read threshold is not included in a set of default read thresholds, which correspond to multiple historical read thresholds in multiple entries of the read level table, the read threshold optimizer 530 may determine a set distance between the historical read threshold and each of the multiple read thresholds and select a historical read threshold with the lowest distance, among the set of the default read thresholds. Then, the read threshold optimizer 530 may use the selected read level table to perform the Bayesian optimization algorithm in FIG. 11.

Figure 14:
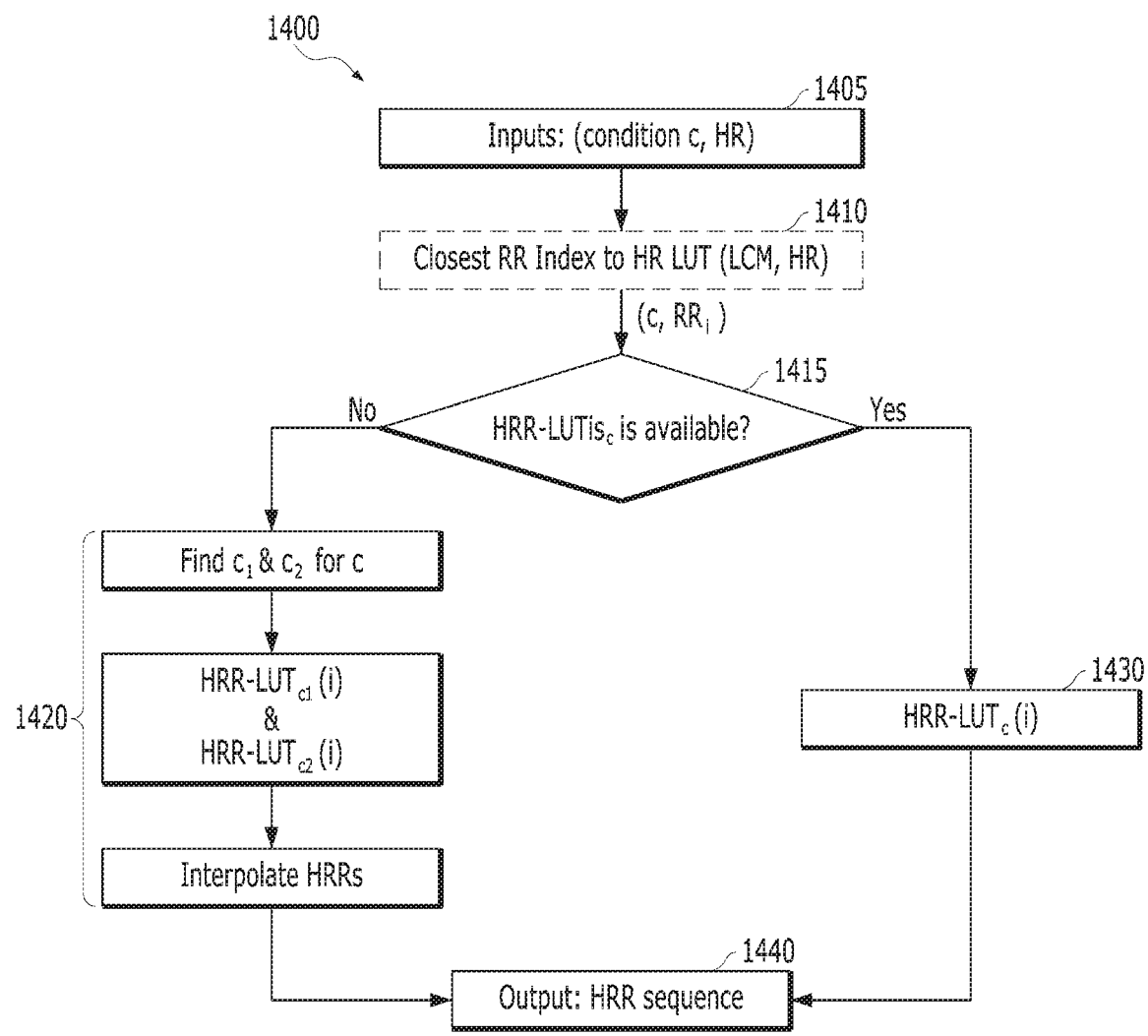
FIG. 14 is a flowchart illustrating schemes for determining a selection order of read retry thresholds in accordance with an embodiment of the present invention.

FIG. 14 is a flowchart illustrating a scheme 1400 for determining an order in which read retry thresholds are selected in accordance with an embodiment of the present invention.

Referring to FIG. 14, the scheme 1400 combines all the previous algorithms in FIGS. 11 to 13 to obtain a practical algorithm that uses optimal HRRs for a particular condition. For the scheme 1400, input information including a condition and a historical read threshold are provided. Operation 1410 may be selectively performed. After the operation 1410 is performed, operation 1420 or 1430 may be performed depending on the result of operation 1415. In operation 1415, it is determined whether or not there is a read level table corresponding to the particular condition. After the operation 1420 or 1430 is performed, operation 1440 may be performed. Operation 1410 corresponds to the algorithm of FIG. 13. Operation 1420 corresponds to the algorithm of FIG. 12. Operations 1430 and 1440 corresponds to the algorithm of FIG. 11. In operation 140, the order of read retry thresholds HRRs are determined based on fail bit counts and a sequence of HRRs is output.

Figure 15:
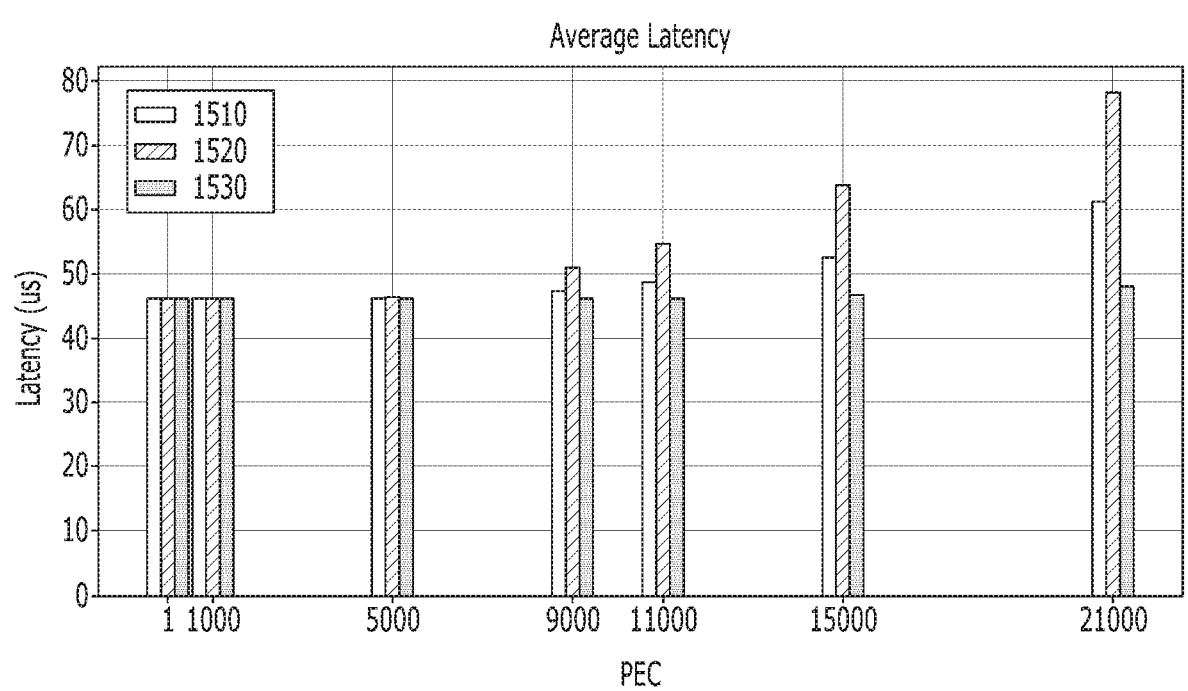
FIG. 15 is a graph illustrating performance comparison between fixed read retry thresholds selection schemes and an operation of selecting read retry thresholds in accordance with an embodiment of the present invention.

FIG. 15 is a graph illustrating performance comparison between read operations using static read retry thresholds selection schemes (i.e., static read operations) and a read operation using smart RRs algorithm (i.e., smart read operation) in accordance with an embodiment of the present invention.

Referring to FIG. 15, x-axis represents program/erase cycles (PEC) and y-axis represents latency (us). The average latency of the smart read operation (1530) is shown in comparison to static read operations (1510, 1520). In the read operation 1510, the set of read thresholds is fixed for all conditions, i.e., different program/erase cycles. The order of read thresholds is as follows: $RR_H$, $RR_0$, $RR_1$, $RR_2$, $RR_3$, $RR_4$, ..., $RR_{10}$. The set of read thresholds does not change with condition and does not depend on historical read $RR_H$. In the read operation 1520, the set of read thresholds also does not change with condition and does not depend on historical read $RR_H$. The simulation results show that the smart read operation reduces read latency and improves QoS.

As described above, embodiments provide a scheme capable of obtaining optimal read retry thresholds (i.e., HRRs) among all possible historical reads for a given condition of a memory system (i.e., NAND condition). The read retry threshold optimization scheme may improve read quality of service (QoS) of a memory system without any change to hardware of the memory system.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A memory system comprising:
   a memory device including a plurality of cells; and
   a controller coupled to the memory device and configured to:
   select from plural read level tables a read level table based on an operational condition indicative of a present state of the memory device at a time of reading the cells, the read level table including multiple entries, each entry including a set of read thresholds including a historical read threshold and multiple read retry thresholds;
   select an entry among the multiple entries in the selected read level table based on the historical read threshold;
   for the selected entry,
   determine fail bits for data associated with multiple read operations on the plurality of cells using the multiple read retry thresholds; and
   arrange an order of the multiple read retry thresholds based on the fail bits determination.

2. The memory system of claim 1, wherein the condition includes combinations of values from an erase/write (EW) cycle array of values, a single page read (SPRD) cycle array of values and type of page associated with the plurality of cells.

3. The memory system of claim 1, wherein the controller is configured to:
   determine the order of the multiple read retry thresholds to be an ascending order of fail bit counts.

4. The memory system of claim 1, wherein the controller is further configured to:
   estimate two conditions closest to the condition when the condition does not correspond to any of multiple defined conditions;
   select from the plural read level tables two read level tables corresponding to the two conditions; and
   use the two read threshold tables to perform selecting an entry, determining fail bits and determining the order of the multiple read thresholds.

5. The memory system of claim 4, wherein the controller is configured to:
   perform interpolation with respect to the two read level tables to generate an interpolated read level table and use the interpolated read level table to perform selecting an entry, determining fail bits and determining the order of the multiple read thresholds.

6. The memory system of claim 1, wherein the controller is further configured to:
   when the historical read threshold is not included in a set of default read thresholds, which correspond to multiple historical read thresholds in the multiple entries, compute a set distance between the historical read threshold and each of the multiple read thresholds; and
   select a historical read threshold with the lowest distance, among the set of the default read thresholds.

7. The memory system of claim 6, wherein the controller is further configured to:
   for an entry with the selected read threshold as a historical read threshold,
   determine fail bits and determine the order of the multiple read thresholds.

8. The memory system of claim 6, wherein the set distance includes an Euclidean distance.

9. A method for operating a memory system including a memory device including a plurality of cells and a controller, the method comprising:
   selecting from plural read level tables a read level table based on an operational condition indicative of a present state of the memory device at a time of reading the cells, the read level table including multiple entries, each entry including a set of read thresholds including a historical read threshold and multiple read retry thresholds;
   selecting an entry among the multiple entries in the selected read level table based on the historical read threshold;
   for the selected entry,
   determining fail bits for data associated with multiple read operations on the plurality of cells using the multiple read retry thresholds; and
   arranging an order of the multiple read retry thresholds based on the fail bits determination.

10. The method of claim 9, wherein the condition includes combinations of values from an erase/write (EW) cycle array of values, a single page read (SPRD) cycle array of values and a type of a page associated with the plurality of cells.

11. The method of claim 9, wherein the determining of the order of the multiple read retry thresholds includes:
    determining the order of the multiple read retry thresholds to be an ascending order of fail bit counts.

12. The method of claim 9, further comprising:
    estimating two conditions closest to the condition when the condition does not correspond to any of multiple defined conditions;
    selecting from the plural read level tables two read level tables corresponding to the two conditions; and
    using the two read threshold tables to perform selecting an entry, determining fail bits and determining the order of the multiple read thresholds.

13. The method of claim 12, further comprising:
    performing interpolation with respect to the two read level tables to generate an interpolated read level table and using the interpolated read level table to perform selecting an entry, determining fail bits and determining the order of the multiple read thresholds.

14. The method of claim 9, further comprising:
    when the historical read threshold is not included in a set of default read thresholds, which correspond to multiple historical read thresholds in the multiple entries, computing a set distance between the historical read threshold and each of the multiple read thresholds; and
    selecting a historical threshold with the lowest distance, among the set of the default read thresholds.

15. The method of claim 14, further comprising:
    for an entry with the selected read threshold as a historical read threshold,
    determining counting fail bits and determining the order of the multiple read thresholds.

16. The method of claim 14, wherein the set distance includes an Euclidean distance.

17. A memory system comprising:
    a memory device including a plurality of cells; and a controller coupled to the memory device and configured to:
select from plural read level tables a read level table based on an operational condition indicative of a present state of the memory device at a time of reading the cells, the read level table including multiple entries, each entry including a set of read thresholds including a historical read threshold and multiple read retry thresholds;
determine whether the historical read threshold is included in a set of default read thresholds, which correspond to multiple historical read thresholds in the multiple entries;
determine whether the condition corresponds to any of multiple defined conditions;
when it is determined that the historical read threshold is included in the set of the default read thresholds and the condition corresponds to any of the multiple defined conditions, select an entry among the multiple entries in the selected read level table based on the historical read threshold;
for the selected entry,
determine fail bits for data associated with multiple read operations on the plurality of pages using the multiple read retry thresholds; and
arrange an order of the multiple read retry thresholds based on the fail bits determination.

18. The memory system of claim 17, wherein the condition include combinations of values from an erase/write (EW) cycle array of values, a single page read (SPRD) cycle array of values and type of page associated with the plurality of cells, and wherein the controller is configured to:
determine the order of the multiple read retry thresholds to be an ascending order of fail bit counts.

19. The memory system of claim 17, wherein the controller is further configured to:
estimate two conditions closest to the condition when the condition does not correspond to any of multiple defined conditions;
select from the plural read level tables two read level tables corresponding to the two conditions; and
perform interpolation with respect to the two read level tables to generate an interpolated read level table and use the interpolated read bias table to perform selecting an entry, determining fail bits and determining the order of the multiple read thresholds.

20. The memory system of claim 17, wherein the controller is further configured to:
when it is determined that the historical read threshold is not included in the set of the default read thresholds, compute a set distance between the historical read threshold and each of the multiple read thresholds;
select a historical read threshold with the lowest distance, among the set of the default read thresholds; and
for an entry with the selected read threshold as a historical read threshold,
determine fail bits and determine the order of the multiple read thresholds.

* * * * *